United States Patent
Blichasz et al.

(10) Patent No.: US 6,964,585 B2
(45) Date of Patent: Nov. 15, 2005

(54) ELECTRICAL CONNECTOR HAVING SURGE SUPPRESSING DEVICE

(75) Inventors: Charles Blichasz, Boiling Springs, PA (US); Michael A. Yeomans, Camp Hill, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/794,127

(22) Filed: Mar. 4, 2004

(65) Prior Publication Data

US 2005/0197006 A1    Sep. 8, 2005

(51) Int. Cl.[7] .............................................. H01R 25/00
(52) U.S. Cl. .................... 439/638; 439/676; 439/540.1
(58) Field of Search ............................... 439/638, 639, 439/540.1, 541.5, 701, 676, 620

(56) References Cited

U.S. PATENT DOCUMENTS

| | | | |
|---|---|---|---|
| 4,392,701 A * | 7/1983 | Weidler | 439/76.1 |
| 4,726,638 A | 2/1988 | Farrar et al. | |
| 4,799,901 A | 1/1989 | Pirc | |
| 5,658,166 A * | 8/1997 | Freeman et al. | 439/540.1 |
| 6,383,028 B1 * | 5/2002 | Chang | 439/638 |

* cited by examiner

*Primary Examiner*—Alexander Gilman
(74) *Attorney, Agent, or Firm*—Wei Te Chung (57) ABSTRACT

An electrical connector (100) includes a first housing member (1), a second housing member (2) coupled with the first housing member to define an internal space therebetween, and a subassembly (3) received in the space. The first housing member has a first mating face (11) defining a first upper and lower cavities (111, 112). The second housing member has a second mating face (21) defining a second upper and lower cavities (211, 212). The subassembly includes a pair of terminal modules (31, 32) and a pair of surge suppressing devices (33, 34). The upper and lower terminal modules respectively include a PCB (311, 321) and a number of front and rear conductive terminals (312, 313, 322, 323) mounted on the PCB. The front and rear terminals are exposed in a corresponding first and second cavities. The surge suppressing devices are mounted respective one of the PCBs and electrically connect with corresponding front and rear terminals.

9 Claims, 7 Drawing Sheets

ELECTRICAL CONNECTOR HAVING SURGE SUPPRESSING DEVICE

CROSS-REFERENCE TO RELATED APPLICATION

This application is related to another invention entitled "ADAPTER HAVING TRANSIENT SUPPRESSION PROTECTION", invented by the same inventor and assigned to the common assignee as the present invention.

BACKGROUND OF THE INVENTION

1. Field of the Invention

The present invention relates to electrical connectors and more particularly to an electrical connector having a built-in device for providing surge suppressing protection for conductive circuits to which the connector terminals are electrically connected.

2. Description of the Prior Art

Electrical circuitry often must be protected from damage caused by power surges owing to electrostatic discharges (ESD) and electromagnetic pulses (EMP). The high voltage generated by ESD and EMP can damage voltage sensitive integrated circuits and the like. Means for protecting against power surges include the use of additional specialized circuitry within equipment, such as voltage variable resistors. Protection can also be achieved by the use of connectors or adapters having transient voltage suppressing and filtering devices therein, thereby eliminating the need for costly and extensive modification of the equipment itself.

While it is possible to design a new equipment with specialized circuits for protection from power surges, it is also desirable to provide protection for existing equipment and/or provide protection for sensitive electronic equipment. Often there is a need to interconnect a plurality of pieces of electronic equipment together. The equipment may be wired directly or interconnected through the use of one or more adapters. If the equipment itself does not have protection from power surges, or additional protection is desired, these adapters may be provided with such protection. Adapters with built-in transient suppression device are disclosed in U.S. Pat. Nos. 4,726,638 and 4,799,901.

U.S. Pat. No. 4,726,638 discloses a transient voltage suppression device consisting of a dielectric substrate with a ground surface area on a lower surface thereof, a plurality of transient voltage protectors mounted on an upper surface of the substrate and connected to the ground surface area through apertures in the substrate, and the ground plate attached to the bottom of the jack housing and contacting the ground surface area. The transient voltage suppressions are in the form of diodes and are connected to respective jack contacts via conductive paths on the substrate. The substrate is partially received in the housing to engage with the ground plate, which occupies significant space. Alternatively, the substrate is attached to the bottom of the housing, whereby the height of the modular jack is increased. Furthermore, the ground plate is individually attached to a bottom surface of the housing, which requires modification to the housing according to the specific configuration of the ground plate, thereby complicating manufacture and increasing production cost.

U.S. Pat. No. 4,799,901 issued to Pirc on Jan. 24, 1989 discloses a modular jack having transient voltage suppression protection. The Pirc connector comprises upper and lower housings, a first and second connector subassemblies, a transient voltage suppression members and a grounding shell. The first and second connector subassemblies include, respectively, first and second dielectric support members and first and second terminals. The transient voltage suppression members includes a circuit board having a plurality of electrical circuit components mounted thereon, and grounding strap having grounding legs extending through apertures in the circuit board. It is clearly that the structure of the Pirc jack is too complicated to be manufactured and assembled. Moreover, the first and second subassemblies and the housing means are provided separately, thus increasing manufacture processes of assembling the connector. Furthermore, as telecommunications devices have become more technologically advanced and integrated, requirements have become important for modular jacks providing multiplications of outlets. The housing and the grounding shell as disclosed in Pirc jack must be substituted when adding an extra outlet in the connector, which is a disadvantage to decrease the cost.

Hence, an electrical connector having an improved surge suppressing device is required to overcome the disadvantages of the prior art.

SUMMARY OF THE INVENTION

An object of the present invention is to provide an improved electrical connector for interconnecting two or more pieces of electronic equipments while protecting these equipments from power surges.

Another object of the present invention is to provide a modular jack having an easily assembled power surge suppressing device.

An electrical connector includes a first housing member, a second housing member coupled with the first housing member to define an internal space therebetween, and a subassembly received in the space. The first housing member has a first mating face defining a first upper and lower cavities. The second housing member has a second mating face defining a second upper and lower cavities. The subassembly includes a pair of terminal modules and a pair of surge suppressing devices respectively mounted on the terminal modules. The upper and lower terminal module respectively include a PCB and a plurality of front and rear conductive terminals mounted on the PCB. The front and rear terminals are exposed in a corresponding first and second cavities. The surge suppressing devices are mounted respective one of the PCBs and electrically connect with corresponding front and rear terminals.

Other objects, advantages and novel features of the invention will become more apparent from the following detailed description when taken in conjunction with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which following.

DETAILED DESCRIPTION OF THE INVENTION

Figure 1:
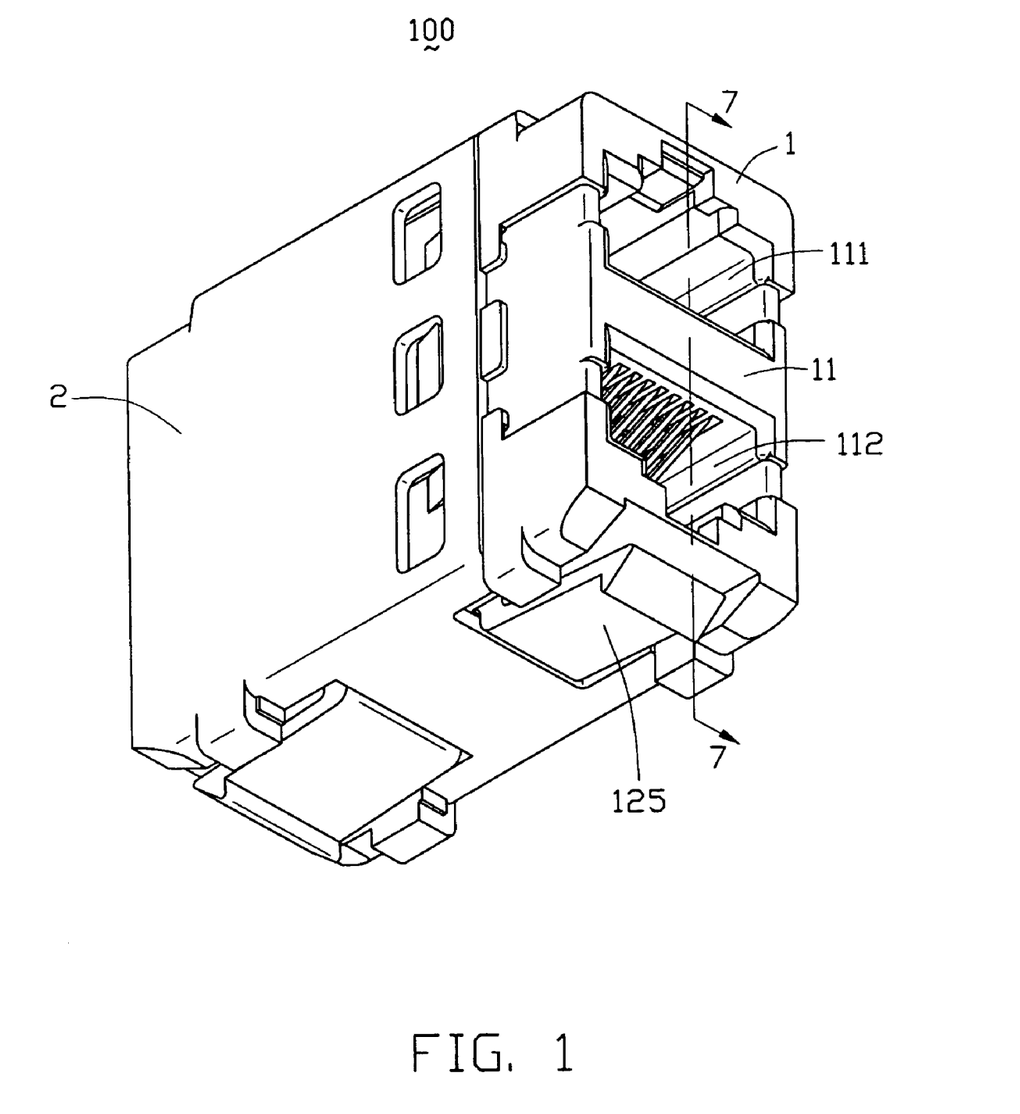
FIG. 1 is a perspective view of an electrical connector according to the present invention.
Figure 2:
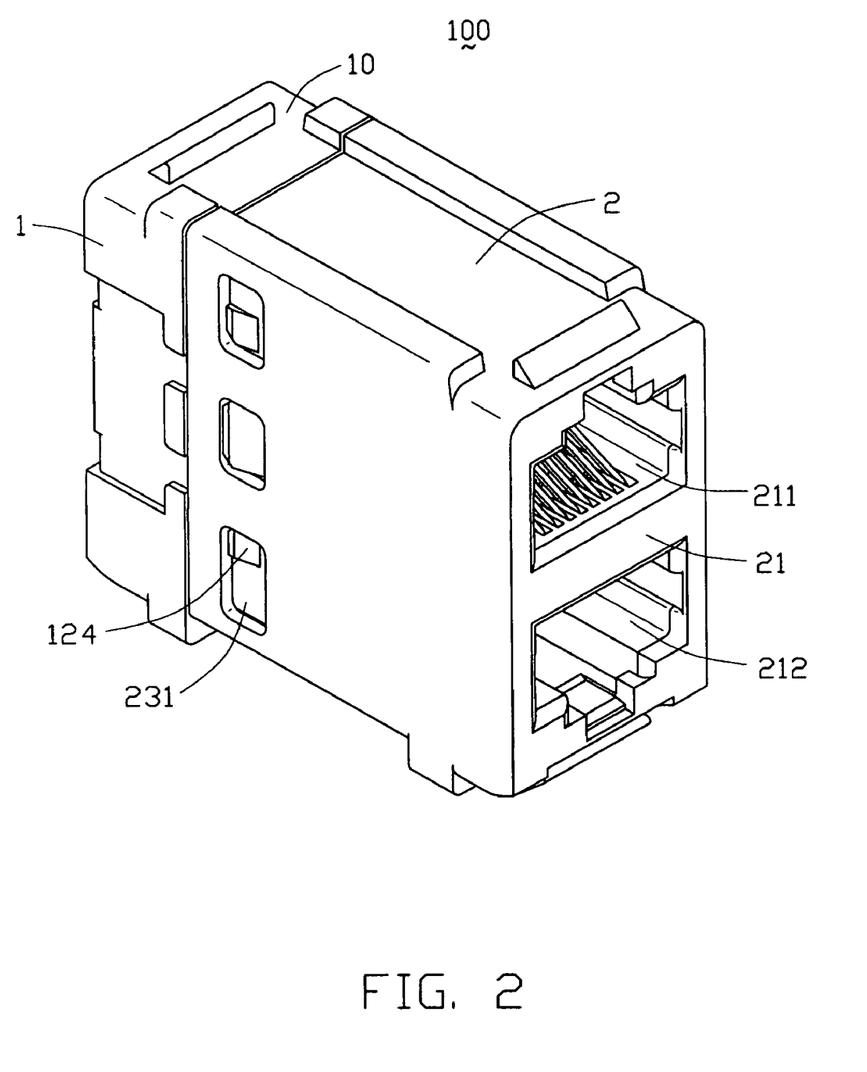
FIG. 2 is another perspective view of the adapter.
Figure 3:
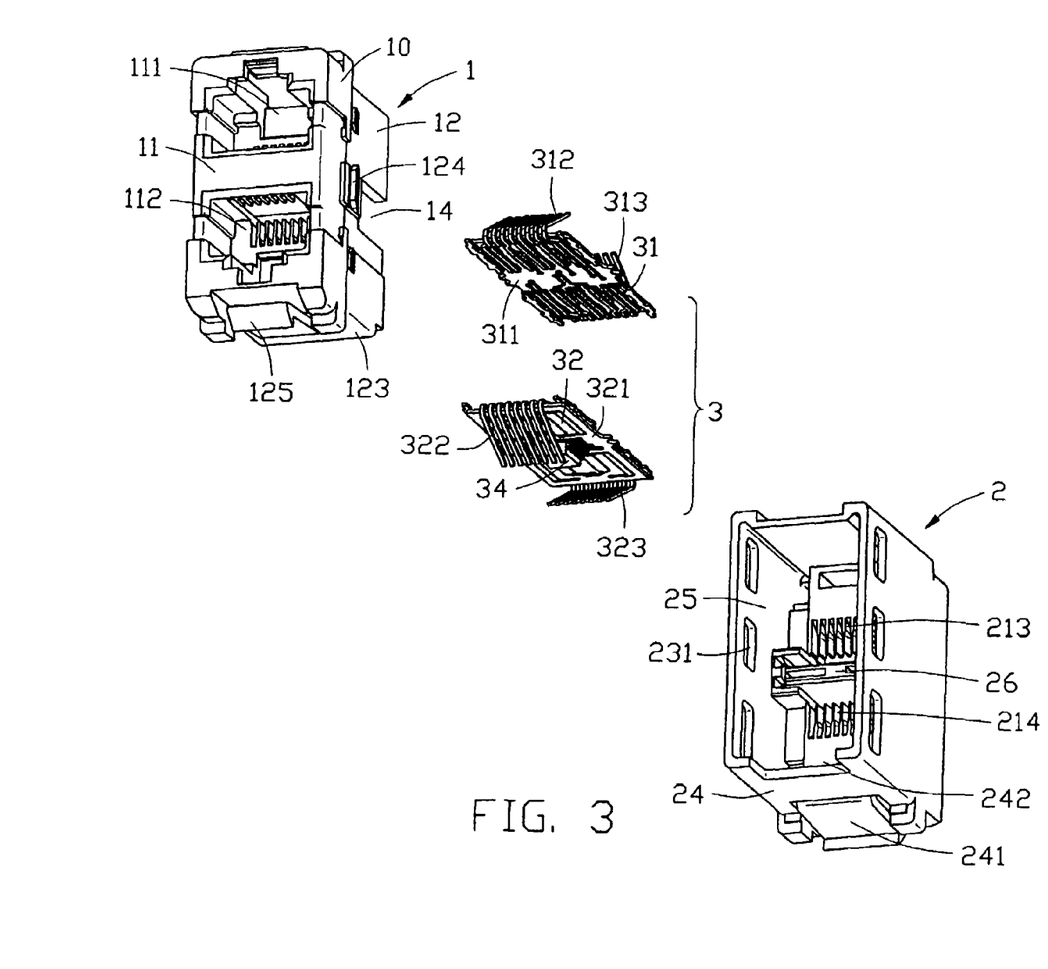
FIG. 3 is an exploded view of FIG. 1.

Referring to FIGS. 1, 2 and 3, an electrical connector 100 comprises dielectric housing means having a first and second housing members 1, 2 and a subassembly 3 received in the housing means. The first and second housing member 1, 2 are coupled together to define an internal space to receive the subassembly 3 therein. The dielectric housing means have a first and second mating faces 11, 21 each provides first and second receiving cavities 111, 112, 211, 212 extending thereinto for mating with complementary connectors (not shown). The subassembly 3 includes a first and second terminal modules 31, 32 and a first and second surge suppressing devices respectively mounted on the first and second terminal modules 31, 32. For purpose of illustration, the electrical connector 100 is shown as a network coupler having a plurality of modular jacks for particularly connecting between pieces of modular plugs. It should be noted that the electrical connector 100 can also be a multi-port connector and provide a plurality of receiving cavities in juxtaposed or side-by-side arrangement for mating with complementary connectors. However, it should be understood that various features of the invention are equally applicable for other types of connectors, as will be fully understandable from the following detailed description.

Figure 4:
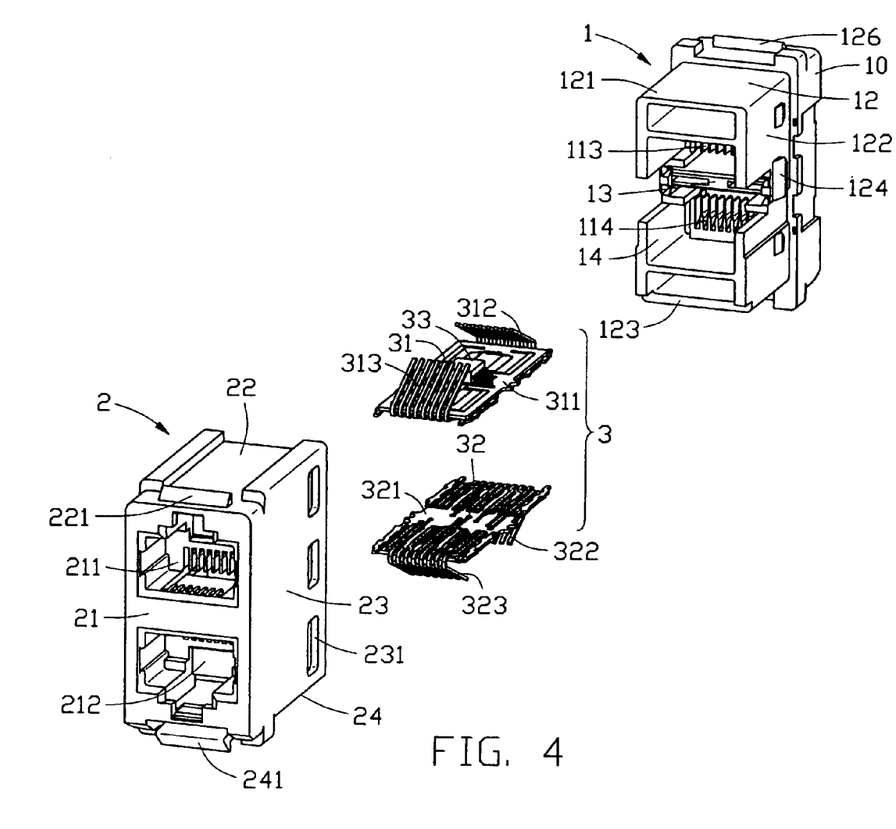
FIG. 4 is another exploded view of FIG. 1.

Referring to FIGS. 3 and 4, the first housing member 1 is substantially rectangular ladder shaped and includes a front base portion 10 having a front first mating face 11 and a rear coupling portion 12 for engaging with the second housing member 2. The first mating face 11 provides a first upper and lower cavities 111, 112 extending rearwardly thereinto for receiving complementary connectors (not shown) therein. The first upper cavity 111 shares a dividing wall 13 with the first lower cavity 112. The coupling portion 12 comprises a pair of rear sidewalls 122, a rear upper wall 121 connecting with upper portions of the sidewalls 122 and a rear bottom wall 123 connecting with lower portions of the sidewalls 122 to defining a first receiving space 14 therein. Each rear sidewall 122 has a plurality of outwardly projecting locking portions 124 for engaging with the second housing member 2. A plurality of first upper and lower passageways 113, 114 are provided on a respective side of the dividing wall 13, and, respectively, communicating with the first upper and lower cavities 111, 112 and the first receiving space 14. The rear bottom wall 123 provides a first lower latching portion 125 extending downwardly and forwardly toward the first mating face 11. The first lower latching portion 125 includes a planar portion (not labeled) essentially parallel to and spaced from a bottom surface of the rear bottom wall 123, and a downwardly projecting taper portion (not labeled) at a free end thereof. The base portion 10 further has a first upper latching portion 126 extending upwardly from a top surface thereof 10. The first upper and lower latching portions 126, 125 are provided to engaging with counterpart portions of an electrical equipment (not shown) on which the adapter 100 is mounted, thereby securely assembled the adapter to the electrical equipment.

Referring to FIGS. 2, 3 and 4, the second housing member 2 includes a second mating face 21 providing a second upper and lower cavities 211, 212 extending thereinto, a second upper wall 22, two second sidewalls 23, a second bottom wall 24 and a second receiving space 25. Each second sidewall 23 defines a plurality of locking holes 231 for engaging with corresponding locking portions 124 of the first housing member 1. The second upper cavity 211 shares a second dividing wall 26 with the second lower cavity 212. A plurality of second upper and lower passageways 213, 214 are provided on a respective side of the second dividing wall 26. The second upper and lower cavities 211, 212 respectively communicate with the second receiving space 25 via the second upper and lower passageways 213, 214. The second bottom wall 24 includes an opening 242 in a front portion and a lower latching portion 241 in a rear portion. The opening 242 communicates with the second receiving space 25 for receiving the first lower latching portion 125 of the first housing member 1. The first lower latching portion 125 of the first housing member 1 and the second lower latching portion 241 of the second housing member 2 are identical in configuration and structure except that they are oriented to opposite directions. The second upper wall 22 has a second upper latching portion 221 projecting upwardly from a top surface thereof. The second upper and lower latching portions 221, 241 are provided to act as a same function with the first upper and lower latching portions 126, 125.

Figure 5:
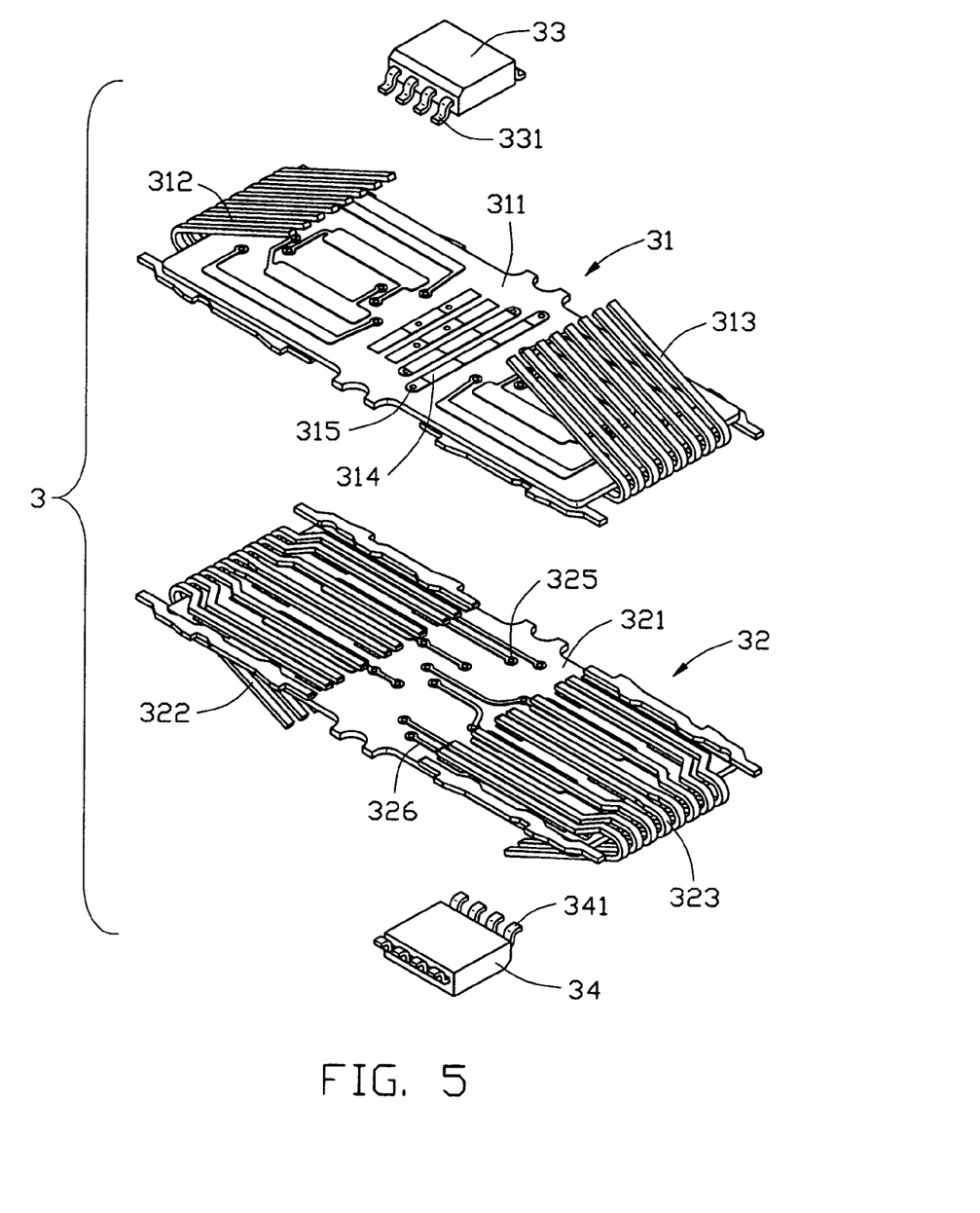
FIG. 5 is an exploded view of a subassembly shown in FIG. 3 taken from top aspect.
Figure 6:
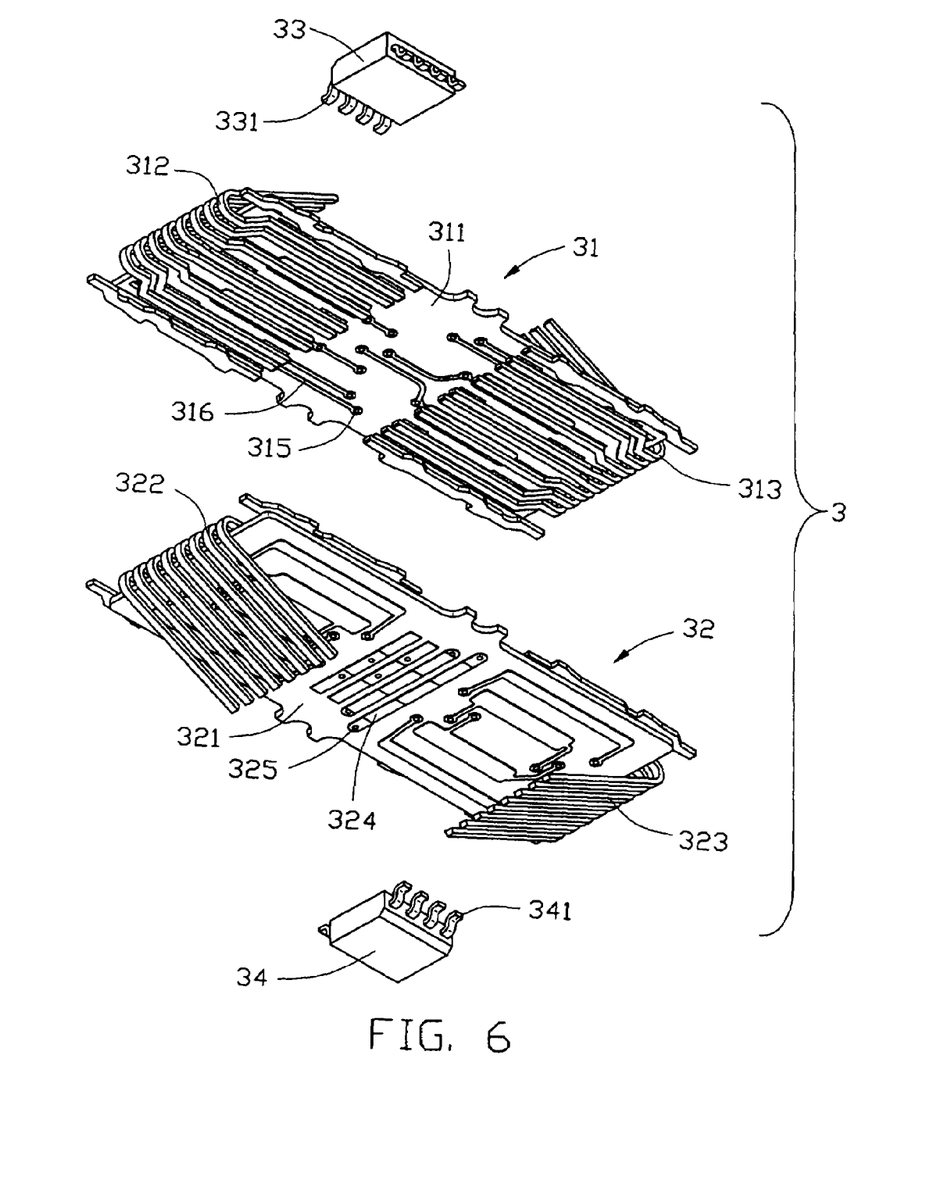
FIG. 6 is another exploded view of the subassembly shown in FIG. 5 taken form bottom aspect.
Figure 7:
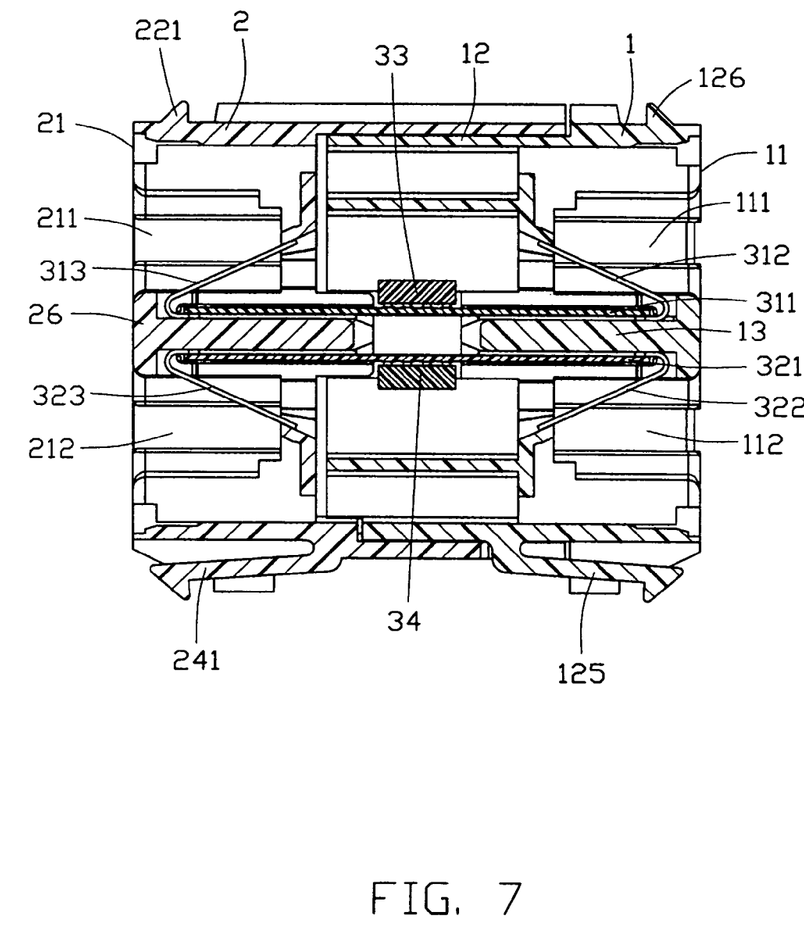
FIG. 7 is a cross-sectional view of the electrical connector taken along line 7—7 of FIG. 1.

Referring to FIGS. 5 and 6, the subassembly 3 includes a first and second terminal modules 31, 32 and a first and second surge suppressing devices 33, 34. In the preferred embodiment, the first and second terminal modules 31, 32 are identical in configuration and structure, and the first and second surge suppressing devices 31, 32 are also identical. The first terminal module 31 includes a first printed circuit board (PCB) 311 and a plurality of first and second conductive terminals 312, 313 respectively mounted on a front and rear portions of the first PCB 311. The first PCB 311 comprises a mounting area 314 on one surface thereof, a plurality of first connecting traces 316 on the other surface thereof and a plurality of first conductive vias 315 through the mounting area and the first connecting traces 316. The first surge suppressing device 33 has a plurality of first tails 331 soldered to the first mounted area 314 of the first PCB 311. The first and second terminals 312, 313 electrically connect with the surge suppressing device 33 via corresponding first connecting trace 316 and the first vias 315. Similarly, the second terminal module 32 includes a second PCB 321 and a plurality of third and forth conductive terminals 322, 323 respectively mounted on a front and rear portions of the second PCB 321. The second PCB 321 comprises a second mounting area 324 on one surface thereof, a plurality of second connecting traces 326 on the other surface thereof and a plurality of second conductive vias 325 through the second mounting area 324 and the second connecting traces 326. The second surge suppressing device 34 has a plurality of second tails soldered to the second mounted area 324 of the second PCB 321. The third and forth terminals 322, 323 electrically connect with the second surge suppressing device 34 and via the second connecting trace 326 and the second vias 325. The first and second surge suppressing devices 33, 34 are substantially standard modules for protecting from voltage surges and are comprised of a bi-directional diode. The structure and the function of the first and second surge suppressing devices 33, 34 are well known to those skilled in the art, and the technology of circuitry arrangement of the first and second PCB is also well known to those skilled in the art, detailed descriptions are omitted herein.

Referring to FIGS. 1 through 7, in assembly, the subassembly 3 is embedded in the first housing member 1 from a first receiving space 14. The first and second terminal modules 31, 32 carrying the first and second surge suppressing devices 33, 34 respectively extend forwardly along top and bottom surfaces of the first dividing wall 13. The first and third conductive terminals 312, 322 extend through corresponding first upper and lower passageways 113, 114 and are exposed in corresponding first upper and lower cavities 111, 112. The first and second terminal modules 31, 32 are positioned on a respective side of the first dividing wall 13 and are mirror images about the first dividing wall 13. The second housing member 2 is coupled to the first housing member 1 to form the electrical connector 100. The second receiving space 25 of the second housing member 2 is placed over the coupling portion 12 of the first housing member 1. The locking holes 231 of the second housing member 2 lock with the locking portions 124 of the first housing member 1. The second and forth conductive terminals 313, 323 respectively extend along an top and bottom surfaces of the second dividing walls 26, and run through respective ones of the second upper and lower passageways 213, 214 and into the second upper and lower receiving cavities 211, 212 for mating with the complementary connector (not shown). The first and second dividing walls 13, 26 are substantially coplanar. The first standoff 125 of the first housing member 1 is received in the opening 242 of the second housing member 2.

While terms such "front", "rear", "upper" and "lower" have been used to help describe the invention as it is illustrated, it should be understood that the electrical connector 100 can be used in any orientation with respect to earth.

It is to be understood, however, that even though numerous, characteristics and advantages of the present invention have been set fourth in the foregoing description, together with details of the structure and function of the invention, the disclosed is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   a dielectric housing means including a front and rear mating faces and a pair of dividing walls respectively extending inwardly from the front and rear mating faces toward each other, each face providing an upper an lower cavities extending inwardly thereinto; and
   a subassembly received in the housing means, the subassembly including an upper and lower terminal modules positioned on a respective side of the dividing walls and being mirror images about the dividing walls, and an upper and lower surge suppressing devices, the upper terminal module comprising an upper circuit board carrying a plurality of first and second conductive terminals thereon, the first and second terminals respectively extending into the upper cavities of the front and rear mating faces, the upper surge suppressing device mounted on the upper circuit board and electrically connecting with corresponding first and second terminals, the lower terminal module comprising a lower circuit board carrying a plurality of third and forth conductive terminals thereon, the third and forth terminals respectively extending into the lower cavities of the front and rear mating faces, the lower surge suppressing device mounted on the lower circuit board and electrically connecting with corresponding third and fourth terminals wherein the respective terminals extend through corresponding upper and lower passageways being provided on the respective sides of the dividing walls.

2. The electrical connector according to claim 1, wherein the upper and lower circuit board each includes a plurality of connecting traces electrically connecting with corresponding first and second terminals, and conductive vias interconnecting the connecting traces and the surge suppressing device.

3. The electrical connector according to claim 1, wherein the upper and lower terminal modules are substantially identical in configuration and structure.

4. The electrical connector assembly according to claim 1, wherein the upper and the lower surge suppressing device are surface mountable.

5. The electrical connector assembly according to claim 1, wherein the dielectric housing means comprises a first and second housing member coupled together.

6. The electrical connector assembly according to claim 5, wherein the first housing member having a plurality of outwardly projecting locking portions, and wherein the second housing member defining a plurality of locking holes engaging with the locking portions of the first housing member.

7. An electrical connector comprising:
   an insulative housing assembly defining horizontally opposite first and second mating ports;
   a printed circuit board horizontally disposed in the housing;
   a first set of terminals disposed in the first mating port with tails mounted to a first end of the printed circuit board;
   a second set of terminals disposed in the second mating port with tails mounted to a second end of the printed circuit board;
   a set of conductive traces formed in the printed circuit board to electrically connect the first and second sets of terminals, respectively;
   a surge suppressing device mounted on a middle portion of the printed circuit board and electrically connected to the said set of conductive traces; wherein
   contact portions of first set of terminals and contact portions of the second set of terminals are located on same surface of the printed circuit board while extend in different directions horizontally symmetrical to each other with regard to said surge suppressing device horizontally opposite third and d four mating ports in the housing, another printed circuit board horizontally disposed in the housing, a third set of terminals disposed in the third mating port with tails mounted to one end of said another printed circuit board, a forth set of terminals disposed in the fourth mating port with tails mounted to the other end of said another printed circuit board; another set of conductive traces formed in said another printed circuit board to electrically connect the third and fourth sets of terminals, respectively; another surge suppressing device mounted on a middle portion of said another printed circuit board and eclectically connected to said another set of conductive traces, wherein contact portions of the third set of terminals and contact portions of the fourth set of terminals are located on another same surface of the printed circuit board while extend in different derisions horizontally symmetrical to each other with regard to said another surge suppressing device, wherein the housing form a first dividing wall between the first and the third mating ports and a second dividing wall between the second and the fourth mating ports.

8. The connector according to claim 7, wherein said first set of terminals and said third set of terminals are symmetrical to each other vertically, and said second set of terminals and said fourth set of terminals are symmetrical to each other vertically.

9. The electrical connector according to claim 7, wherein said printed circuit board and said another printed circuit board are symmetrical to each other vertically.

* * * * *